(12) United States Patent
Chien et al.

(10) Patent No.: US 11,791,444 B2
(45) Date of Patent: Oct. 17, 2023

(54) DISPLAY APPARATUS

(71) Applicant: Au Optronics Corporation, Hsinchu (TW)

(72) Inventors: Chih-Wei Chien, Hsinchu (TW); Chih-Hsiang Yang, Hsinchu (TW); Shau-Yu Tsai, Hsinchu (TW); Cheng-Chuan Chen, Hsinchu (TW); Chih-Ling Hsueh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 267 days.

(21) Appl. No.: 17/376,184

(22) Filed: Jul. 15, 2021

(65) Prior Publication Data

US 2022/0238768 A1   Jul. 28, 2022

(30) Foreign Application Priority Data

Jan. 27, 2021   (TW) .................................. 110103100

(51) Int. Cl.
*H01L 33/58* (2010.01)
*H01L 25/075* (2006.01)

(52) U.S. Cl.
CPC .......... *H01L 33/58* (2013.01); *H01L 25/0753* (2013.01); *H01L 2933/0091* (2013.01)

(58) Field of Classification Search
CPC ................. H01L 33/58; H01L 25/0753; H01L 2933/0091
See application file for complete search history.

(56) References Cited

U.S. PATENT DOCUMENTS

| | | | |
|---|---|---|---|
| 10,468,394 B1* | 11/2019 | Xi | H01L 25/167 |
| 2005/0007000 A1* | 1/2005 | Chou | H10K 50/858 |
| | | | 257/E33.068 |
| 2011/0037923 A1* | 2/2011 | Chuang | G02B 6/0053 |
| | | | 362/606 |
| 2017/0358604 A1* | 12/2017 | Lee | H01L 27/1248 |
| 2020/0083206 A1* | 3/2020 | Wu | H01L 25/50 |
| 2020/0381474 A1* | 12/2020 | Choi | H01L 33/44 |
| 2021/0032504 A1 | 2/2021 | Tabata | |

FOREIGN PATENT DOCUMENTS

| | | |
|---|---|---|
| CN | 110911391 | 3/2020 |
| CN | 111446348 | 7/2020 |
| CN | 111599909 | 8/2020 |
| CN | 111682019 | 9/2020 |
| TW | 201942277 | 11/2019 |
| TW | 202029549 | 8/2020 |

* cited by examiner

*Primary Examiner* — Mary Ellen Bowman
(74) *Attorney, Agent, or Firm* — JCIPRNET

(57) ABSTRACT

A display apparatus including a circuit substrate, a plurality of light-emitting elements, an optical film, and an adhesive layer is provided. These light-emitting elements are electrically bonded to the circuit substrate. The optical film overlaps the light-emitting elements. The light-emitting elements are disposed between the optical film and the circuit substrate. The adhesive layer is disposed between the optical film and the circuit substrate, and connects the light-emitting elements and the optical film. A cavity is provided between the light-emitting elements, the circuit substrate, and the adhesive layer.

15 Claims, 7 Drawing Sheets

DISPLAY APPARATUS

CROSS-REFERENCE TO RELATED APPLICATION

This application claims the priority benefit of Taiwan application serial no. 110103100, filed on Jan. 27, 2021. The entirety of the above-mentioned patent application is hereby incorporated by reference herein and made a part of this specification.

BACKGROUND

Technology Field

The disclosure relates to a display technology, and particularly to a display apparatus.

Description of Related Art

Light-emitting diode (LED) panels include an active element device substrate and a plurality of light-emitting diode elements transferred on the active element device substrate. Inheriting the characteristics of light-emitting diodes, a light-emitting diode panel is expected to become the mainstream of the next generation of display panels due to the advantages of power saving, high efficiency, high brightness, and fast response time. Currently, there are two main packaging methods for LED display panels. One is a packaging method that uses a traditional package and is fixed through a surface mounted device (SMD). The other is a packaging method in which light-emitting diode elements are directly bonded to the bonding pads of a chip on board (COB) and encapsulated with epoxy.

Although the light-emitting diode panel adopting SMD packaging method has better light extraction efficiency, color uniformity, and reworkability, its light-emitting diode elements are more susceptible to damage by external impact, and the light-emitting diode panel has poor flatness of the overall display surface. While the light-emitting diode panel adopting the other COB packaging method can achieve better surface flatness, the light-emitting diode panel has poor light extraction efficiency and poor color uniformity, and repairing the light-emitting diode elements causes great difficulties.

SUMMARY

The disclosure provides a display apparatus having better reworkability and performance in the dark state.

The display apparatus of the disclosure includes a circuit substrate, a plurality of light-emitting elements, an optical film, and an adhesive layer. The light-emitting elements are electrically bonded to the circuit substrate. The optical film overlaps the light-emitting elements. The light-emitting elements are disposed between the optical film and the circuit substrate. The adhesive layer is disposed between the optical film and the circuit substrate and connects the light-emitting elements and the optical film. There is a cavity between the light-emitting elements, the circuit substrate and the adhesive layer.

In an embodiment of the disclosure, in the display apparatus, the film thickness of part of the adhesive layer that does not overlap the light-emitting elements is greater than the film thickness of another part of the adhesive layer that overlaps the light-emitting elements.

In an embodiment of the disclosure, in the display apparatus, the film thickness of the part of the adhesive layer ranges from 0.02 mm to 1.0 mm.

In an embodiment of the disclosure, in the display apparatus, the light-emitting elements have an element surface. The element surface has a height relative to a substrate surface of the circuit substrate in a direction. The adhesive layer has a surface facing the substrate surface. There is a distance between the surface of the adhesive layer and the element surface of the light-emitting elements in the direction, and a percentage value of the distance to the height ranges from 1% to 70%.

In an embodiment of the disclosure, in the display apparatus, the light-emitting elements are disposed on the circuit substrate at a first pitch and a second pitch in a first direction and a second direction, respectively. Each of the light-emitting elements has a first width and a second width in the first direction and the second direction, the first direction is perpendicular to the second direction, and a percentage value of a product of the first width and the second width to a product of the first pitch and the second pitch ranges from 1% to 70%.

In an embodiment of the disclosure, in the display apparatus, transmittance of the adhesive layer is greater than or equal to 90%.

In an embodiment of the disclosure, in the display apparatus, an optical density of the adhesive layer ranges from 0 to 1.0.

In an embodiment of the disclosure, in the display apparatus, the adhesive layer has a plurality of scattering particles.

In an embodiment of the disclosure, in the display apparatus, a Shore hardness value of the adhesive layer ranges from A20 to D80.

In an embodiment of the disclosure, in the display apparatus, the optical film includes a polarizing layer.

In an embodiment of the disclosure, in the display apparatus, the optical film further includes a plurality of optical microstructures disposed on a side of the polarizing layer away from the light-emitting elements.

In an embodiment of the disclosure, in the display apparatus, the optical film has a surface treatment layer disposed on a side of the adhesive layer away from the light-emitting elements, and the surface treatment layer is an anti-glare layer, an anti-reflection layer, an anti-glare low-reflection layer, and an anti-reflection anti-glare layer, or a low-reflection layer.

In an embodiment of the disclosure, in the display apparatus, a reflecting layer is disposed on part of a surface of the circuit substrate that does not overlap the light-emitting elements.

In an embodiment of the disclosure, in the display apparatus, a plurality of optical microstructures are disposed on an element surface of the light-emitting elements away from the circuit substrate.

In summary, in the display apparatus of an embodiment of the disclosure, the optical film is connected to a plurality of light-emitting elements through the adhesive layer. The light-emitting elements disposed on the circuit substrate are covered by the optical film to improve the surface flatness of the display apparatus on one side of the display surface. On the other hand, there is a cavity between the light-emitting elements between part of the adhesive layer that is not connected to the light-emitting elements and the circuit substrate. With the configuration of the cavity, it is much easier for the optical film to rework, the difficulty of repairing the light-emitting elements is effectively reduced, and thereby the repair yield of the display apparatus is improved.

DESCRIPTION OF THE EMBODIMENTS

Figure 1:
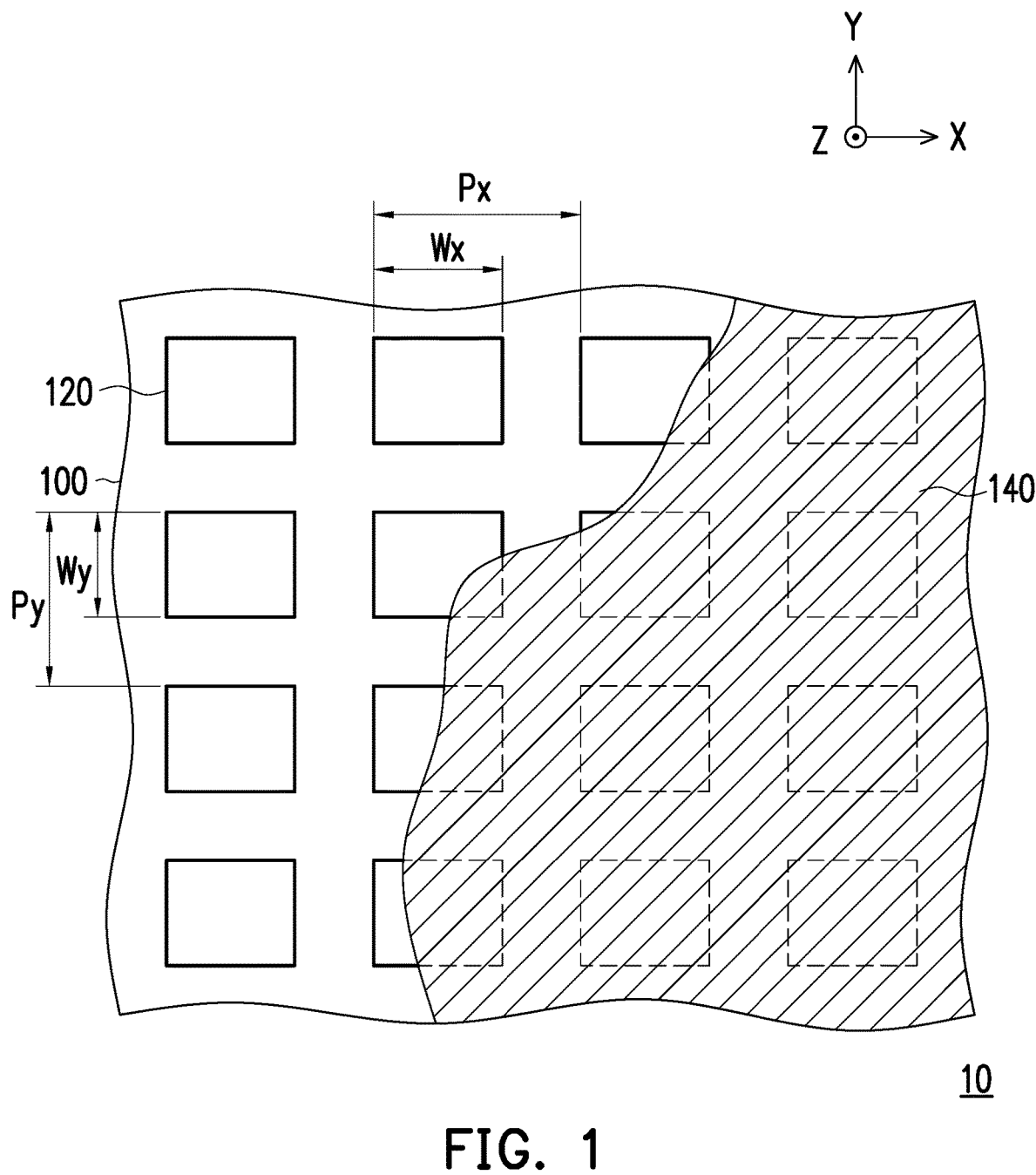
FIG. 1 is a schematic top view of a display apparatus according to a first embodiment of the disclosure.

The term "about", "approximately", "essentially" or "substantially" used herein includes the value and an average value within an acceptable deviation range of specific values determined by a person of ordinary skill in the art, taking into account discussed measurements and a specific number of measurement-related errors (i.e., limitations of a measuring system). For example, the term "about" may mean being within one or more standard deviations of the value, or within, for example, ±30%, ±20%, ±10%, and ±5%. Moreover, the term "about", "approximately", "essentially" or "substantially" used herein may mean selecting a more acceptable deviation range or standard deviations according to measurement properties, cutting properties or other properties, without applying a single standard deviation to all properties.

In the drawings, for clarity, a thickness of each film, layer, panel, region, and/or structure may be enlarged. It should be understood that when a device such as a layer, film, region, or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, "connected" may mean being physically and/or electrically connected. Furthermore, two elements being "electrically connected" or "coupled" may mean that there are other elements between the two elements.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 2:
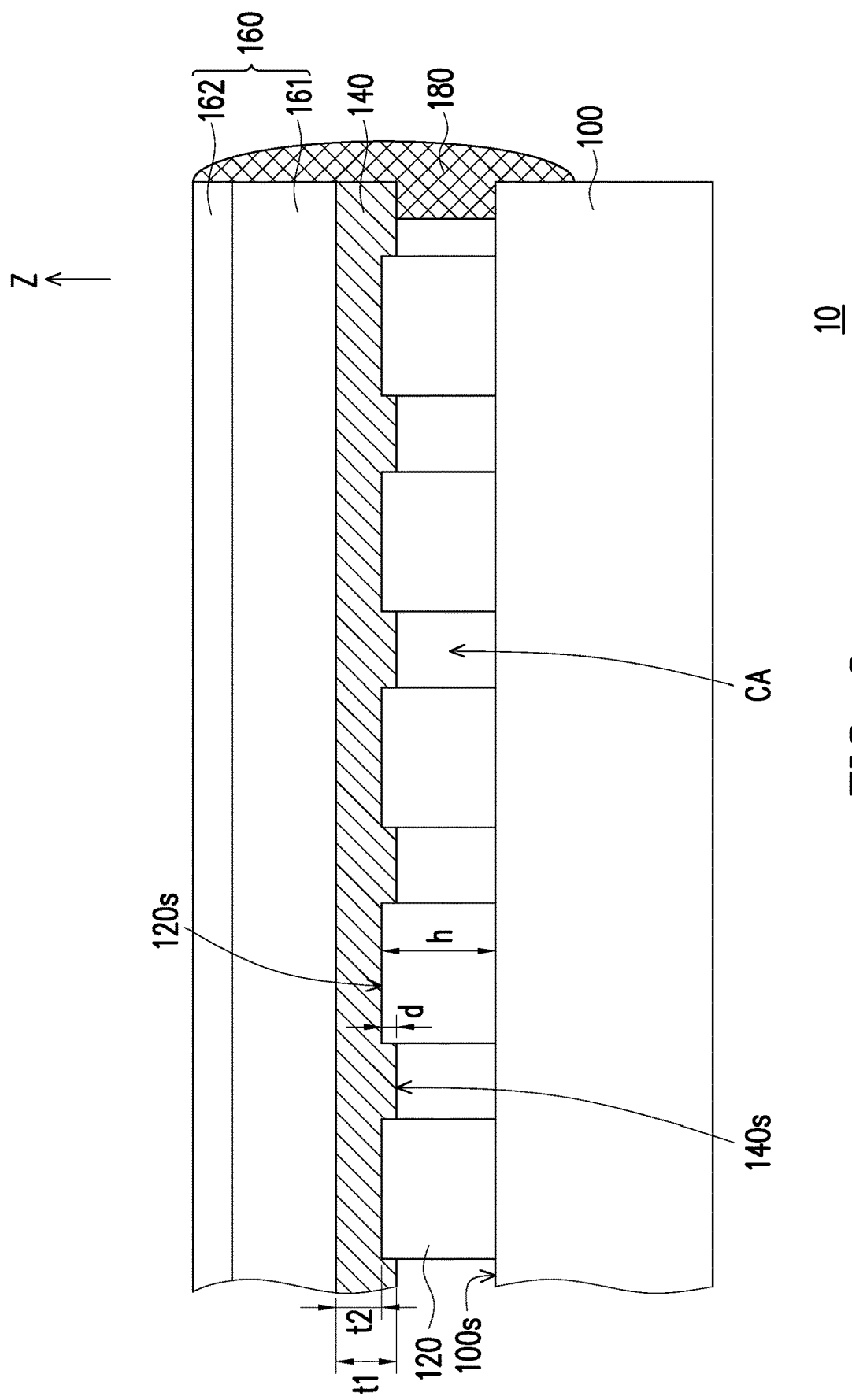
FIG. 2 is a schematic cross-sectional view of the display apparatus of FIG. 1.

FIG. 1 is a schematic top view of a display apparatus according to a first embodiment of the disclosure. FIG. 2 is a schematic cross-sectional view of the display apparatus of FIG. 1. Referring to FIG. 1 and FIG. 2, a display apparatus 10 includes a circuit substrate 100, a plurality of light-emitting elements 120, an adhesive layer 140, and an optical film 160. The light-emitting elements 120 are dispersedly disposed on a substrate surface 100s of the circuit substrate 100 and are electrically bonded to the circuit substrate 100.

For example, the light-emitting elements 120 may be disposed in multiple columns and multiple rows along the direction X and the direction Y, respectively. The direction X is perpendicular to the direction Y. That is, the light-emitting elements 120 can be disposed in an array on the circuit substrate 100, but the disclosure is not limited thereto.

In the embodiment, the circuit substrate 100 is a printed circuit substrate (PCB), for example, but the disclosure is not limited thereto. In other embodiments, the circuit substrate 100 may also be a combination of a glass substrate and a pixel circuit layer. The pixel circuit layer is formed on the glass substrate using a semiconductor process, and the pixel circuit layer can include active elements (e.g., thin film transistors) and various signal lines (e.g., data lines, scan lines, or power lines), but the disclosure is not limited thereto.

The light-emitting element 120 is a micro light-emitting diode (micro LED), a mini light-emitting diode (mini LED), or other sizes of light-emitting diodes, for example. According to different types of structures, the light-emitting element 120 of the embodiment can be a flip-chip type of light-emitting diode, a vertical type of light-emitting diode, or a lateral type of light-emitting diode. For example, the light-emitting elements 120 can be used to emit light of different colors, respectively. The light can have different light intensities according to the image data to be displayed, and the effect of color display is achieved.

Note that the connection between the light-emitting element 120 and the circuit substrate 100 depends on the type of the circuit substrate 100 and the light-emitting element 120, so the drawings in the embodiment only schematically illustrate the connection relationship of the light-emitting element 120 and the circuit substrate 100. For example, in an embodiment not shown, the circuit substrate 100 may have a plurality of bonding pads, the light-emitting element 120 is a flip-chip light-emitting diode, and the light-emitting element 120 is mutually bonded with two corresponding bonding pads on the circuit substrate 100 through two electrodes disposed on the same side of the epitaxial structure, but the disclosure is not limited thereto. In another embodiment not shown, the light-emitting element 120 may also be a vertical light-emitting diode, and the electrode on the side of the light-emitting element 120 away from the circuit substrate 100 is electrically connected to the circuit substrate 100 through connecting wires.

To improve the visual quality of the display apparatus 10 in the dark state (e.g., the contrast in the dark state), an optical film 160 is disposed on the side of the light-emitting elements 120 away from the circuit substrate 100, and the optical film 160 is attached to the light-emitting elements 120 through the adhesive layer 140. That is, the adhesive layer 140 is disposed between the optical film 160 and the circuit substrate 100 and connects the light-emitting elements 120 and the optical film 160. In the embodiment, the optical film 160 is an overlapped structure of a polarizing layer 161 and an anti-glare anti-reflection layer 162, for example. The polarizing layer 161 is a circular polarizing layer, for example, but the disclosure is not limited thereto. In other embodiments, the polarizing layer 161 may also be a linear polarizing layer. For example, the anti-glare anti-reflection layer 162 includes a plurality of surface microstructures and an anti-reflection film plated on the surface microstructures, but the disclosure is not limited thereto.

With the configuration of overlapping the optical film 160 and the light-emitting elements 120, the overall reflectivity of the display apparatus 10 under ambient light irradiation can be significantly reduced. In other words, the anti-glare and anti-reflection characteristics of the display apparatus 10 in the dark state can be effectively improved. Considering the process variation, after each light-emitting element 120 is bonded to the circuit substrate 100, the configuration relationship (e.g., parallel to each other or inclined to each other) between an element surface 120s and the substrate surface 100s of the circuit substrate 100 may be slightly different, resulting in poor surface flatness of the display apparatus on the light emitting side. Therefore, with the configuration of the optical film 160, the surface flatness of the display apparatus 10 on the display surface side can also be improved.

Note that the adhesive layer 140 connecting the element surfaces 120s of the light-emitting elements 120 further extends into the gaps between the light-emitting elements 120 and covers part of the sidewall surfaces of the light-emitting elements 120. In other words, in the normal direction (e.g., direction Z) of the substrate surface 100s of the circuit substrate 100, a film thickness t1 of part of the adhesive layer 140 that does not overlap the light-emitting elements 120 is greater than a film thickness t2 of another part of the adhesive layer 140 that overlaps the light-emitting elements 120. For example, the film thickness t1 of the adhesive layer 140 may range from 0.02 mm to 1.0 mm.

From another view, the element surface 120s of the light-emitting element 120 has a height h relative to the substrate surface 100s of the circuit substrate 100 in the direction Z, the surface 140s of the adhesive layer 140 facing the substrate surface 100s and the element surface 120s of the light-emitting element 120 have a distance d in the direction Z, and the percentage value of the distance d and the height h can range from 1% to 70%. That is, the adhesive layer 140 does not fill the gaps between the light-emitting elements 120, and the substrate surface 100s, part of the sidewalls of the light-emitting elements 120, and the surface 140s of the adhesive layer 140 can define a cavity CA between the light-emitting elements 120. With the configuration of the cavity CA, it is much easier for the optical film 160 to rework, the difficulty of repairing the light-emitting elements 120 can be effectively reduced, and thereby the repair yield of the display apparatus 10 is improved.

On the other hand, the light-emitting elements 120 are disposed on the circuit substrate 100 at pitches Px and Py in the direction X and the direction Y, respectively, and each light-emitting element 120 has a width Wx and a width Wy in the direction X and Y, respectively. To increase the light extraction efficiency of the light-emitting elements 120 at the side viewing angle to improve the light energy utilization rate of the display apparatus 10, the percentage value of the product of the width Wx and the width Wy to the product of the pitch Px and the pitch Py can be set from 1% to 70%.

The material of the adhesive layer 140 includes optical clear adhesives (OCAs), optical sensitive adhesives (PSAs), silicone adhesives, polyurethane reactive (PUR) glue, polyurethane (PU) glue, or other suitable optical-grade adhesive materials. In particular, in the embodiment, the anti-reflection and anti-glare performance of the display apparatus 10 is improved with the configuration of the optical film 160, so the adhesive layer 140 can be selected from optical adhesives with higher transmittance (e.g., optical transparent adhesives). For example, in the embodiment, the transmittance of the adhesive layer 140 may be greater than 90%, but the disclosure is not limited thereto.

Note that the Shore hardness value of the adhesive layer 140 can range from A20 to D80 to serve as a buffer layer for the optical film 160 and the light-emitting elements 120. For example, when the optical film 160 is impacted or squeezed by an external force, the elastic adhesive layer 140 absorbs most of the external force through contraction and deformation, and the light-emitting element 120 is prevented from being damaged by the external force.

In the embodiment, the display apparatus 10 may also optionally include a side sealant 180. The material of the side sealant 180 may include PUR glue, epoxy, silicon glue, photosensitive glue material, or other suitable glue materials. The side sealant 180 is disposed on the periphery of the circuit substrate 100 and is disposed around the light-emitting elements 120. Specifically, the side sealant 180 connects the circuit substrate 100, the adhesive layer 140, and the optical film 160 to define a sealed chamber, and the light-emitting elements 120 are disposed in the sealed chamber. With the configuration of the side sealant 180, not only can the connection relationship between the optical film 160 and the circuit substrate 100 be further stabilized, but also foreign matters in the external environment can be prevented from entering the cavity CA between the light-emitting elements 120.

Other embodiments are provided below for explanation of the disclosure in detail. The same reference numerals are used to indicate the same elements, and the description of the same technical content is omitted. For the description of the omitted parts, reference may be made to the foregoing embodiments, and the same content will not be iterated in the following embodiments.

Figure 3:
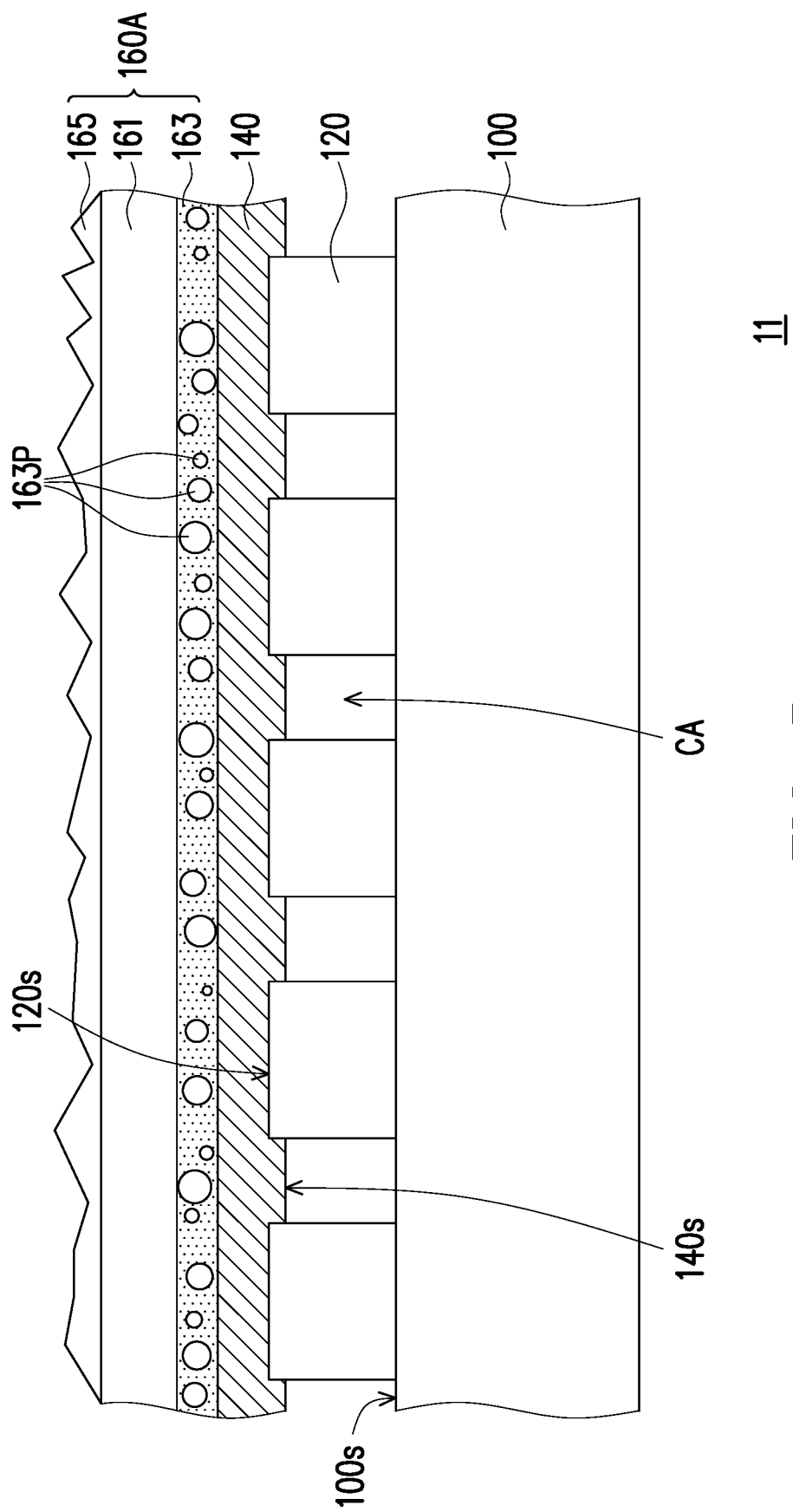
FIG. 3 is a schematic cross-sectional view of a display apparatus according to a second embodiment of the disclosure.

FIG. 3 is a schematic cross-sectional view of a display apparatus according to a second embodiment of the disclosure. Referring to FIG. 3, the main difference between a display apparatus 11 of the embodiment and the display apparatus 10 of FIG. 2 is that the composition of the optical film is different. Specifically, an optical film 160A of the display apparatus 11 has an overlapped structure of the polarizing layer 161, an anti-glare adhesive layer 163, and a surface treatment layer 165. The anti-glare adhesive layer 163 is disposed between the polarizing layer 161 and the adhesive layer 140. The polarizing layer 161 is disposed between the anti-glare adhesive layer 163 and the surface treatment layer 165. In the embodiment, the anti-glare adhesive layer 163 may include a glue material and a plurality of scattering particles 163P doped in the glue material. For example, the glue material is an optical pressure sensitive adhesive, and the material of the scattering particles 163P includes silicone resin or poly(methyl methacrylate) (PMMA), but the disclosure is not limited thereto.

However, the disclosure is not limited thereto. In other embodiments not shown, the optical film 160A can also be directly attached to the light-emitting elements 120 through the anti-glare adhesive layer 163. Therefore, the display apparatus requires no configuration of the adhesive layer 140 of the foregoing embodiment. In the embodiment, the surface treatment layer 165 is formed by roughening the upper surface of the polarizing layer 161, for example. That is, the surface treatment layer 165 may be a surface roughness layer, but the disclosure is not limited thereto.

Figure 4:
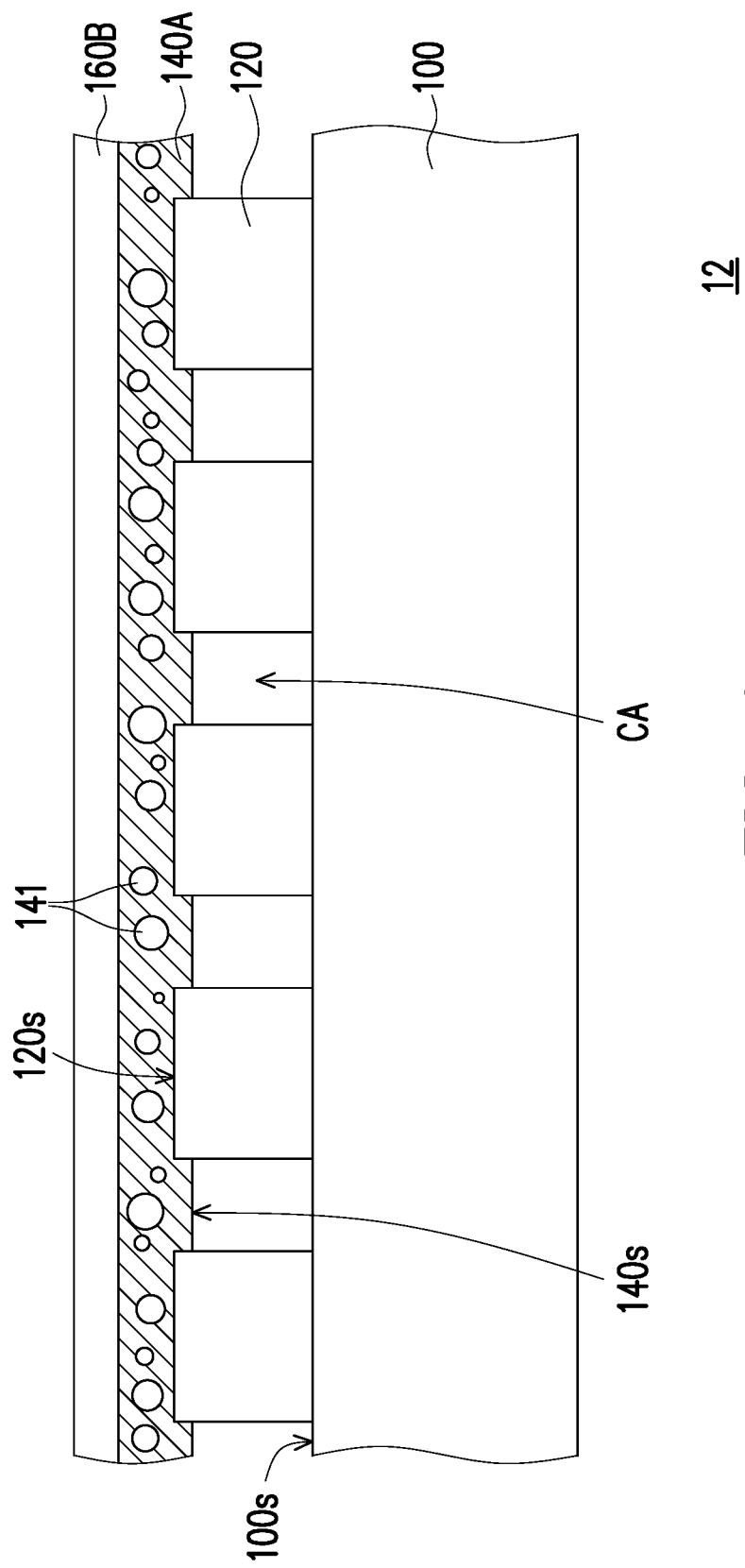
FIG. 4 is a schematic cross-sectional view of a display apparatus according to a third embodiment of the disclosure.
Figure 5:
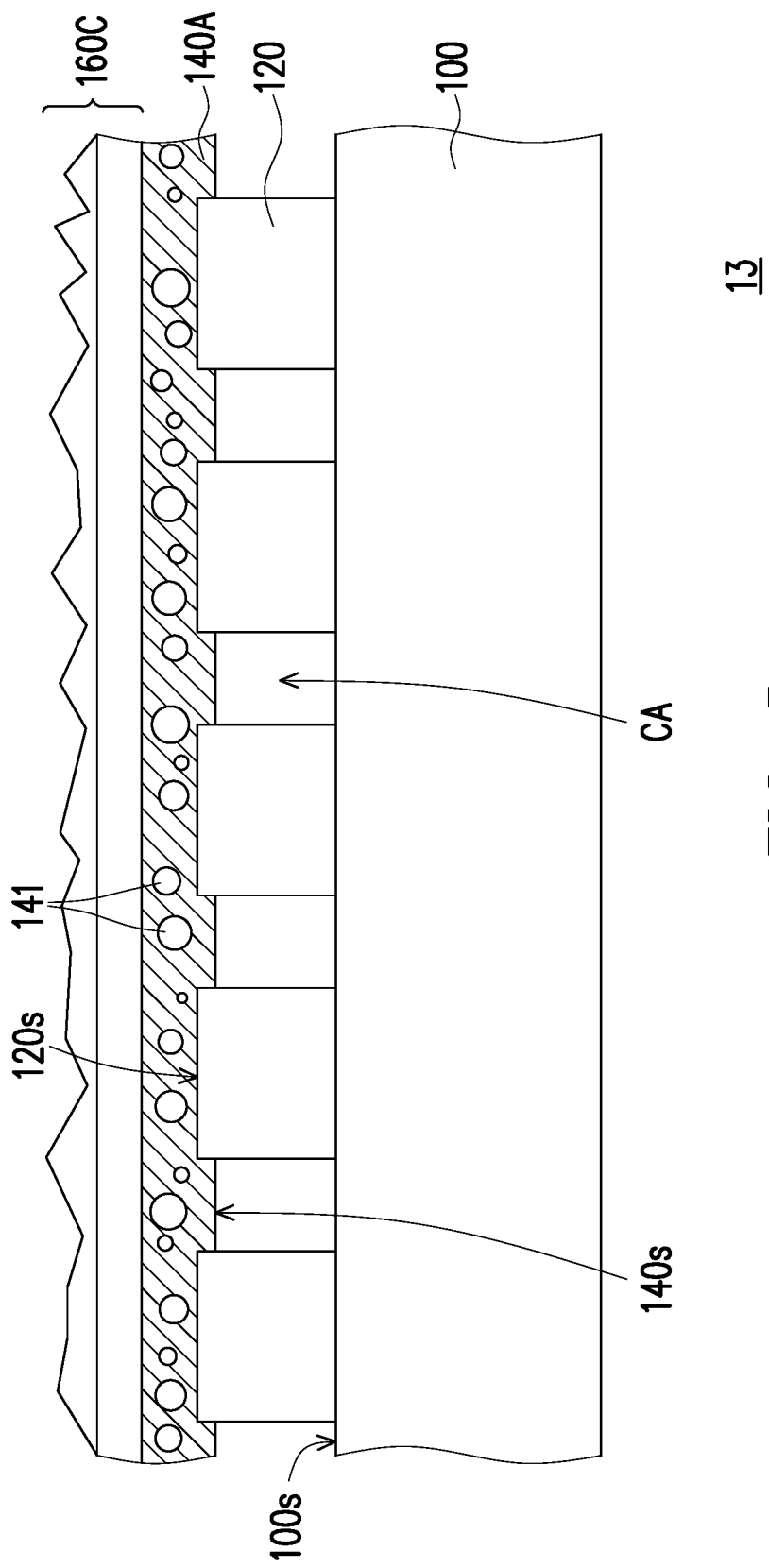
FIG. 5 is a schematic cross-sectional view of a display apparatus according to a fourth embodiment of the disclosure.

FIG. 4 is a schematic cross-sectional view of a display apparatus according to a third embodiment of the disclosure. FIG. 5 is a schematic cross-sectional view of a display apparatus according to a fourth embodiment of the disclosure. Referring to FIG. 4, the difference between a display apparatus 12 of the embodiment and the display apparatus 10 of FIG. 2 is that the compositions of the optical film and the adhesive layer are different. In the embodiment, an adhesive layer 140A may also have a plurality of light-absorbing particles 141, and the light-absorbing particles 141 are adapted for absorbing ambient light from the outside. The material of the light-absorbing particles 141 may include carbon black or masterbatch pigment/dye. For example, the optical density (OD) of the adhesive layer 140A may range from 0 to 1.0.

By doping the light-absorbing particles 141 in the adhesive layer 140A, the design flexibility of an optical film 160B can be increased. In the embodiment, the optical film 160B may be an anti-glare low-reflection layer or a low-reflection layer. However, the disclosure is not limited thereto. Referring to FIG. 5, in other embodiments, an optical film 160C of a display apparatus 13 may also be a surface treatment layer with a rough surface.

Figure 6:
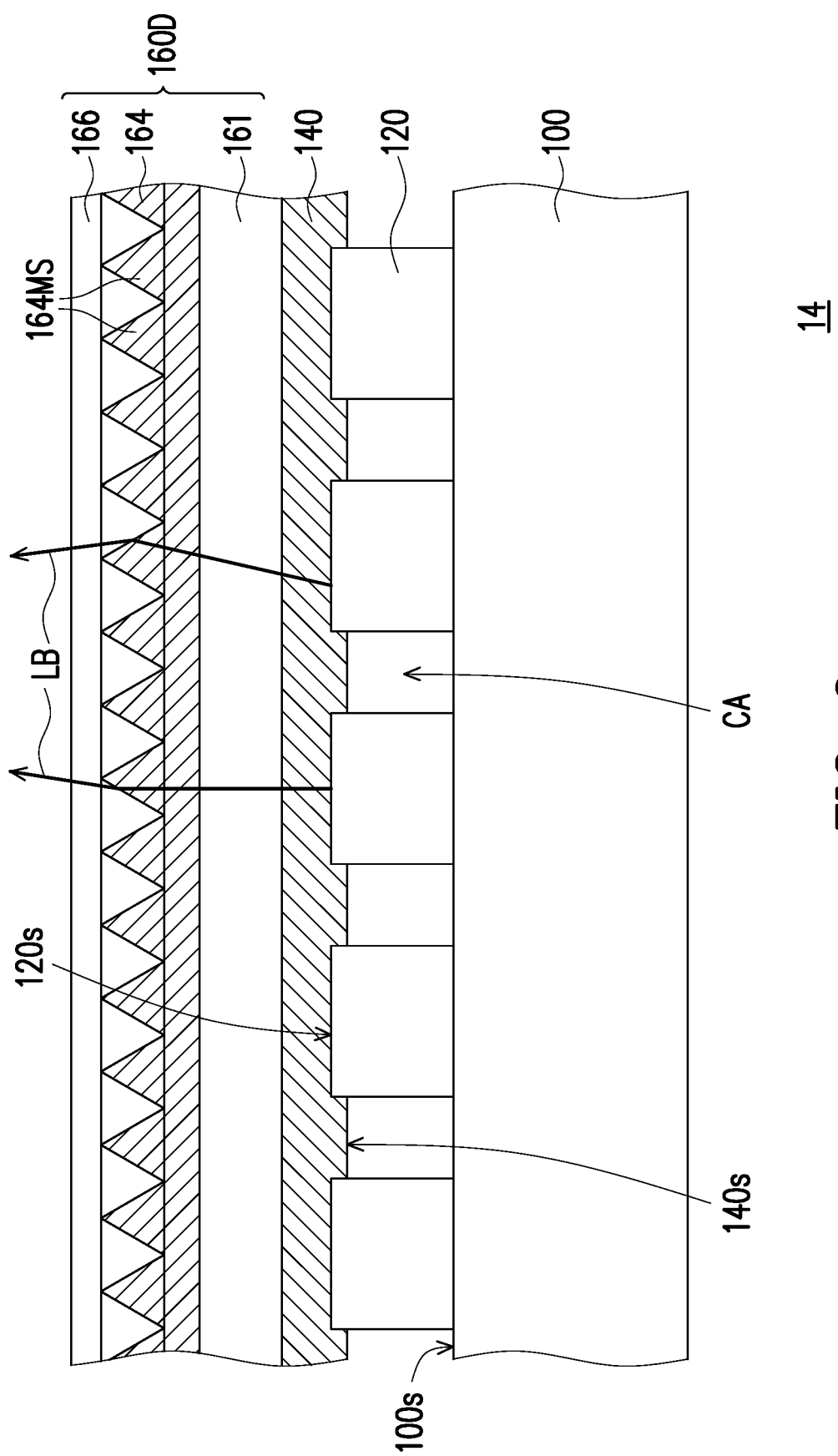
FIG. 6 is a schematic cross-sectional view of a display apparatus according to a fifth embodiment of the disclosure.

FIG. 6 is a schematic cross-sectional view of a display apparatus according to a fifth embodiment of the disclosure. Referring to FIG. 6, the difference between a display apparatus 14 of the embodiment and the display apparatus 10 of FIG. 2 is that the composition of the optical film is different. Specifically, an optical film 160D of the display apparatus 14 is an overlapped structure of the polarizing layer 161, a refracting layer 164, and a surface treatment layer 166, and the refracting layer 164 is disposed between the surface treatment layer 166 and the polarizing layer 161.

For example, in the embodiment, the refracting layer 164 may have a plurality of optical microstructures 164MS. For example, the optical microstructures 164MS are a plurality of microprisms and adapted for deflecting light LB from the light-emitting element 120 to a specific light emitting range, and the light concentration of the display apparatus 14 is increased. In the embodiment, the surface treatment layer 166 is an anti-glare layer, an anti-reflection layer, an anti-glare low-reflection layer, an anti-reflection anti-glare layer, or a low-reflection layer, for example, but the disclosure is not limited thereto.

Figure 7:
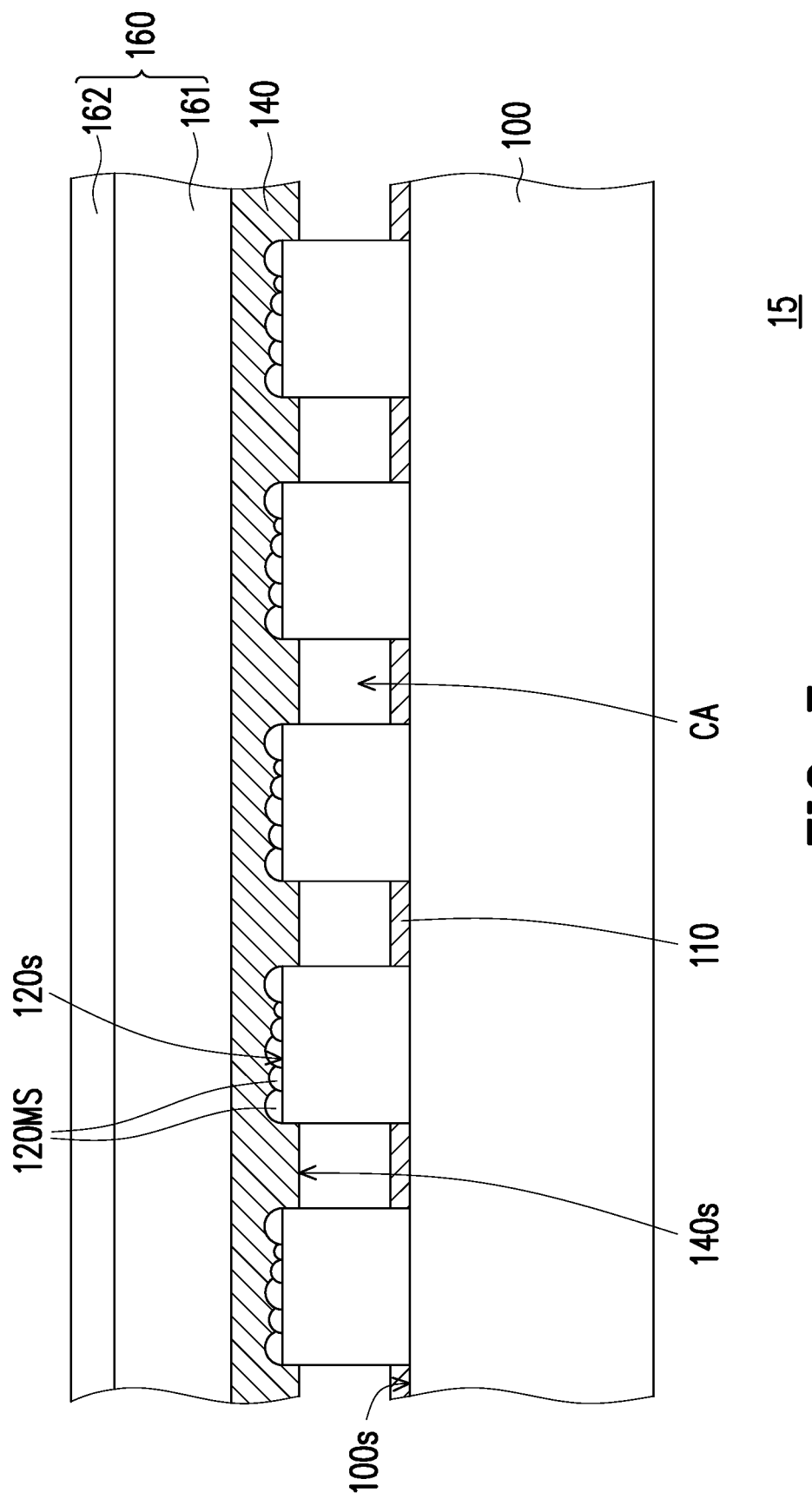
FIG. 7 is a schematic cross-sectional view of a display apparatus according to a sixth embodiment of the disclosure.

FIG. 7 is a schematic cross-sectional view of a display apparatus according to a sixth embodiment of the disclosure. Referring to FIG. 7, the difference between a display apparatus 15 of the embodiment and the display apparatus 10 of FIG. 2 is that a plurality of optical microstructures 120MS are disposed on the element surface 120s of the light-emitting element 120A of the display apparatus 15. The optical microstructures 120MS can increase the roughness of the element surface 120s so that the reflectivity of the element surface 120s to external ambient light is reduced.

On the other hand, in the embodiment, a reflecting layer 110 is further disposed on part of the substrate surface 100s of the circuit substrate 100 that does not overlap the light-emitting elements 120. For example, the reflecting layer 110 is a white paint or a mirror coating to further increase the light extraction efficiency of the display apparatus 15. In particular, due to the configuration of the optical film 160, even if the reflecting layer 110 is disposed on the substrate surface 100s of the circuit substrate 100 to increase the light extraction efficiency, the display apparatus 15 can still have anti-glare and anti-reflection characteristics in the dark state.

In summary, in the display apparatus of an embodiment of the disclosure, the optical film is connected to a plurality of light-emitting elements through the adhesive layer. The light-emitting elements disposed on the circuit substrate are covered by the optical film to improve the surface flatness of the display apparatus on one side of the display surface. On the other hand, there is a cavity between the light-emitting elements between part of the adhesive layer that is not connected to the light-emitting elements and the circuit substrate. With the configuration of the cavity, it is much easier for the optical film to rework, the difficulty of repairing the light-emitting elements is effectively reduced, and thereby the repair yield of the display apparatus is improved.

What is claimed is:

1. A display apparatus comprising:
   a circuit substrate;
   a plurality of light-emitting elements electrically bonded to the circuit substrate;
   an optical film overlapping the light-emitting elements, and the light-emitting elements are disposed between the optical film and the circuit substrate;
   an adhesive layer disposed between the optical film and the circuit substrate and connecting the light-emitting elements and the optical film, wherein there is a cavity between the light-emitting elements, the circuit substrate and the adhesive layer; and
   a side sealant disposed on a periphery of the circuit substrate and around the light-emitting elements to define a sealed chamber, wherein the light-emitting elements are disposed in the sealed chamber, and wherein a part of the sealed chamber is the cavity.

2. The display apparatus according to claim 1, wherein a film thickness of part of the adhesive layer that does not overlap the light-emitting elements is greater than a film thickness of another part of the adhesive layer that overlaps the light-emitting elements.

3. The display apparatus according to claim 2, wherein the film thickness of the part of the adhesive layer ranges from 0.02 mm to 1.0 mm.

4. The display apparatus according to claim 1, wherein the light-emitting elements comprise an element surface, the element surface comprises a height relative to a substrate surface of the circuit substrate in a direction, the adhesive layer comprises a surface facing the substrate surface, there is a distance between the surface of the adhesive layer and the element surface of the light-emitting elements in the direction, and a percentage value of the distance to the height ranges from 1% to 70%.

5. The display apparatus according to claim 1, wherein the light-emitting elements are disposed on the circuit substrate at a first pitch and a second pitch in a first direction and a second direction, respectively, each of the light-emitting elements comprises a first width and a second width in the first direction and the second direction, the first direction is perpendicular to the second direction, and a percentage value of a product of the first width and the second width to a product of the first pitch and the second pitch ranges from 1% to 70%.

6. The display apparatus according to claim 1, wherein transmittance of the adhesive layer is greater than or equal to 90%.

7. The display apparatus according to claim 6, wherein an optical density of the adhesive layer ranges from 0 to 1.0.

8. The display apparatus according to claim 1, wherein the adhesive layer comprises a plurality of scattering particles.

9. The display apparatus according to claim 1, wherein a Shore hardness value of the adhesive layer ranges from A20 to D80.

10. The display apparatus according to claim 1, wherein the optical film comprises a polarizing layer.

11. The display apparatus according to claim 10, wherein the optical film further comprises a plurality of optical microstructures disposed on a side of the polarizing layer away from the light-emitting elements.

12. The display apparatus according to claim 1, wherein the optical film comprises a surface treatment layer disposed on a side of the adhesive layer away from the light-emitting elements, and the surface treatment layer is an anti-glare layer, an anti-reflection layer, an anti-glare low-reflection layer, and an anti-reflection anti-glare layer, or a low-reflection layer.

13. The display apparatus according to claim 1, wherein a reflecting layer is disposed on part of a surface of the circuit substrate that does not overlap the light-emitting elements.

14. The display apparatus according to claim 1, wherein a plurality of optical microstructures are disposed on an element surface of the light-emitting elements away from the circuit substrate.

15. A display apparatus comprising:
a circuit substrate;
a plurality of light-emitting elements electrically bonded to the circuit substrate;
an optical film overlapping the light-emitting elements, and the light-emitting elements are disposed between the optical film and the circuit substrate; and
an adhesive layer disposed between the optical film and the circuit substrate and connecting the light-emitting elements and the optical film, wherein there is a cavity between the light-emitting elements, the circuit substrate and the adhesive layer, and the cavity is adapted for the optical film to rework or adapted to repair the light-emitting elements.

* * * * *